(12) United States Patent
Shalita et al.

(10) Patent No.: US 11,057,001 B2
(45) Date of Patent: Jul. 6, 2021

(54) APPARATUS, SYSTEM, AND METHOD OF DISTRIBUTING A RESET SIGNAL TO A PLURALITY OF PHY CHAINS

(71) Applicant: INTEL CORPORATION, Santa Clara, CA (US)

(72) Inventors: Oren Shalita, Tel-Aviv (IL); Maor Saig, Shaaray Tikva (IL); Ziv Barak, Rishon-Lezion (IL); Hila Hazenshprung, Tirat Yehuda (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/900,960

(22) Filed: Jun. 14, 2020

(65) Prior Publication Data
US 2020/0313620 A1  Oct. 1, 2020

(51) Int. Cl.
H03D 7/16 (2006.01)
H03D 3/00 (2006.01)
H04B 1/28 (2006.01)
H04B 1/30 (2006.01)
H03D 7/14 (2006.01)

(52) U.S. Cl.
CPC ........... H03D 7/165 (2013.01); H03D 3/009 (2013.01); H03D 7/1458 (2013.01); H04B 1/28 (2013.01); H04B 1/30 (2013.01)

(58) Field of Classification Search
CPC ...... H03D 7/165; H03D 3/009; H03D 7/1458; H04B 1/28; H04B 1/30
USPC ........................................................ 455/313
See application file for complete search history.

(56) References Cited

U.S. PATENT DOCUMENTS 9,356,769 B2    5/2016 Lin
2003/0021360 A1 1/2003 Luhman et al.

FOREIGN PATENT DOCUMENTS

| CN | 101488802 | 7/2009 | | |
|---|---|---|---|---|
| CN | 109683137 | 4/2019 | | |
| EP | 0 924 635 | 6/1999 | | |
| EP | 1956480 | 8/2008 | | |
| JP | 4664411 | 4/2011 | | |
| JP | 2013097496 | * 5/2013 | ............... | G06F 1/08 |
| JP | 2013135312 | 7/2013 | | |
| KR | 10-1428787 | 8/2014 | | |
| WO | 2006133225 | 12/2006 | | |

OTHER PUBLICATIONS

Search Report for European Patent Application No. 20210009.5, dated May 17, 2021, 8 pages.

* cited by examiner

Primary Examiner — Lee Nguyen
(74) Attorney, Agent, or Firm — Shichrur & Co.

(57) ABSTRACT

For example, an apparatus may include a Local Oscillator (LO) generator configured to generate a distributed modulated LO signal by modulating an LO signal based on a reset signal; and a plurality of Physical Layer (PHY) chains to receive the distributed modulated LO signal, which is distributed to the plurality of PHY chains by the LO generator, a PHY chain of the plurality of PHY chains including a reset detector configured to detect the reset signal based on the distributed modulated LO signal, and, based on a detection of the reset signal, to reset one or more Radio Frequency (RF) elements of the PHY chain.

25 Claims, 5 Drawing Sheets

APPARATUS, SYSTEM, AND METHOD OF DISTRIBUTING A RESET SIGNAL TO A PLURALITY OF PHY CHAINS

TECHNICAL FIELD

Embodiments described herein generally relate to distributing a reset signal to a plurality of Physical Layer (PHY) chains.

BACKGROUND

Some devices, for example, radar devices and/or wireless communication devices, may include a plurality of Physical Layer (PHY) chains, which may communicate Radio Frequency (RF) signals via a plurality of antennas.

The PHY chains may include one or more elements and/or complements, which may be operated based on a Local oscillator (LO) signal.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
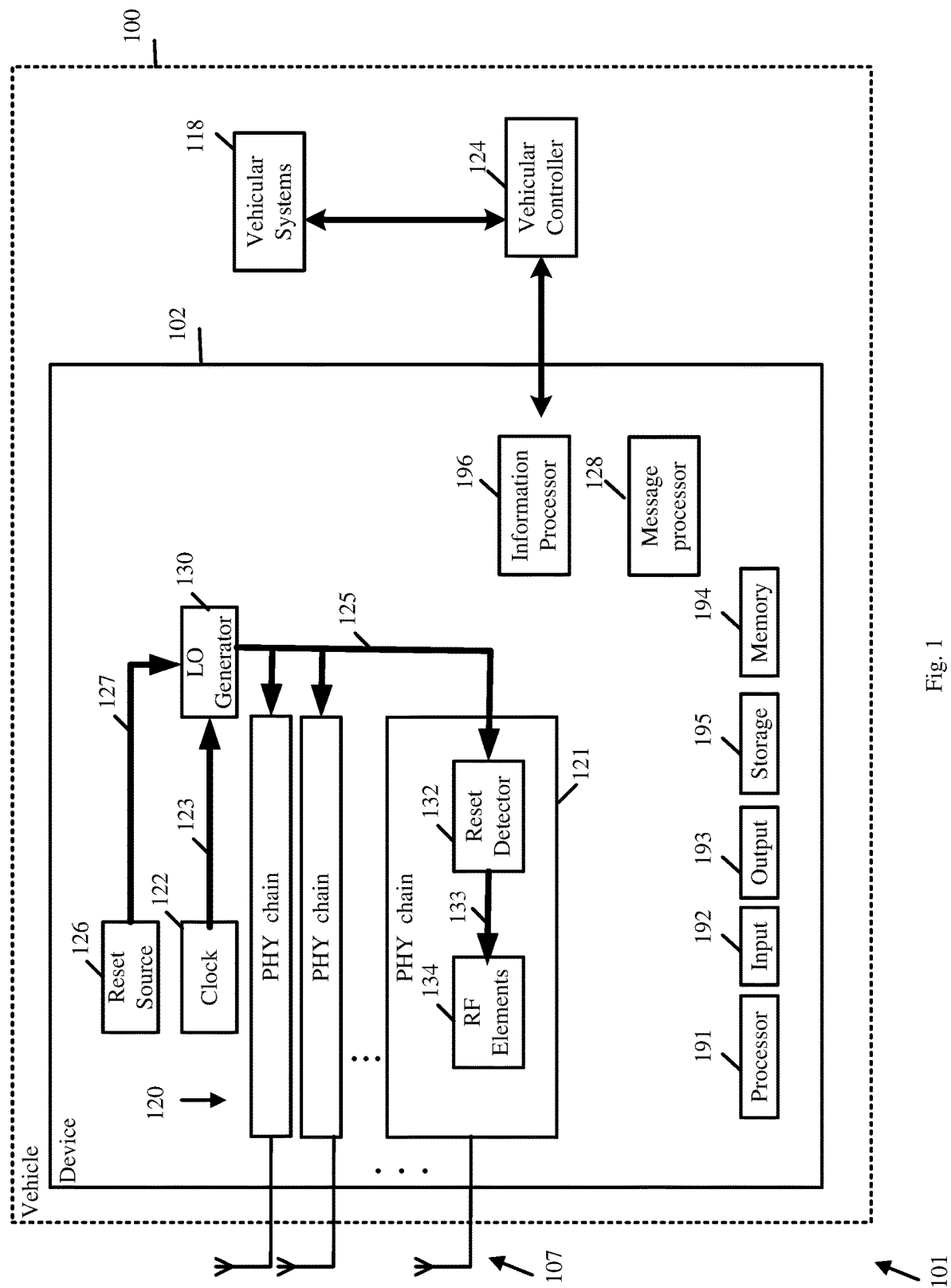
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, a radar sensor, a radar device, a radar system, a vehicle, a vehicular system, an autonomous vehicular system, a vehicular communication system, a vehicular device, a sensor device, a wireless communication device, a User Equipment (UE), a Mobile Device (MD), a wireless station (STA), a Personal Computer (PC), a desktop computer, a mobile computer, a laptop computer, a notebook computer, a tablet computer, a handheld computer, a sensor device, an Internet of Things (IoT) device, a wearable device, a handheld device, a Personal Digital Assistant (PDA) device, a handheld PDA device, a non-vehicular device, a mobile or portable device, a consumer device, a non-mobile or non-portable device, a wireless communication station, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with Radio Frequency (RF) systems, radar systems, vehicular radar systems, detection systems, wireless communication systems, and/or any other systems.

Some embodiments may be used in conjunction with devices and/or networks operating in accordance with existing IEEE 802.11 standards (including IEEE 802.11-2016 (IEEE 802.11-2016, *IEEE Standard for Information technology—Telecommunications and information exchange between systems Local and metropolitan area networks—Specific requirements Part* 11: *Wireless LAN Medium Access Control (MAC) and Physical Layer (PHY) Specifications*, Dec. 7, 2016), and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other embodiments may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device.

Some demonstrative embodiments may be used in conjunction with an RF frequency in a frequency band having a starting frequency above 10 Gigahertz (GHz), for example, a frequency band having a starting frequency between 10 Ghz and 120 GHz. For example, some demonstrative embodiments may be used in conjunction with an RF frequency having a starting frequency above 30 Ghz, for example, above 45 GHz, e.g., above 60 GHz. For example, some demonstrative embodiments may be used in conjunction with an automotive radar frequency band, e.g., a frequency band between 76 GHz and 81 GHz. For example, some demonstrative embodiments may be used in conjunction with wireless communication frequency band, for example, a wireless communication network communicating over a frequency band of 2.4 GHz, 5 GHz, and/or 6-7 GHz, an Extremely High Frequency (EHF) band (the millimeter wave (mmWave) frequency band), e.g., a frequency band within the frequency band of between 20 GHz and 300 GHz, e.g., a frequency band above 45 GHz, a WLAN frequency band, a WPAN frequency band, and the like. However, other embodiments may be implemented utilizing any other suitable frequency bands, for example, a frequency band above 140 GHz, a frequency band of 300 GHz, a sub Terahertz (Thz) band, a THz band, and/or any other frequency band.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna", as used herein, may include any suitable configuration, structure and/or arrangement of one or more antenna elements, components, units, assemblies and/or arrays. In some embodiments, the antenna may implement transmit and receive functionalities using separate and/or different transmit antenna elements and receive antenna elements. In some embodiments, the antenna may implement transmit and receive functionalities using common and/or integrated transmit/receive elements. The antenna may include, for example, a phased array antenna, a single element antenna, a set of switched beam antennas, and/or the like.

Some demonstrative embodiments are described herein with respect to RF signals, e.g., RF radar signals, and/or RF wireless communication signals. However, other embodiments may be implemented with respect to any other wireless signals, wireless communication signals, communication scheme, network, standard and/or protocol.

Reference is now made to FIG. 1, which schematically illustrates a block diagram of a system 101, in accordance with some demonstrative embodiments.

In some demonstrative embodiments, system 101 may include at least one device 102, e.g., as described below.

In some demonstrative embodiments, device 102 may include a radar device. For example, device 102 may include a radar detecting device, a radar sensing device, a radar sensor, or the like, e.g., as described below.

In some demonstrative embodiments, device 102 may include a Multiple Input Multiple Output (MIMO) radar, e.g., as described below.

In other embodiments, device 102 may include any other type of radar, e.g., as described below.

In some demonstrative embodiments, device 102 may be configured to detect, and/or sense, one or more objects, which are located in a vicinity, e.g., a far vicinity and/or a near vicinity, to radar 102, and to provide one or more parameters, attributes, and/or information with respect to the objects.

In some demonstrative embodiments, device 102 may be implemented, for example, as part of a vehicular system.

In some demonstrative embodiments, the vehicular system may include, for example, an autonomous vehicle system, an automated driving system, a driver assistance and/or support system, and/or the like.

In some demonstrative embodiments, system 101 may include a vehicular system including a vehicle 100, e.g., as described below.

In some demonstrative embodiments, one or more elements and/or components of device 102 may be implemented and/or mounted in vehicle 100.

In some demonstrative embodiments, device 102 may be configured to detect, and/or sense, one or more objects, which are located in a vicinity, e.g., a far vicinity and/or a near vicinity, of the vehicle 100, and to provide one or more parameters, attributes, and/or information with respect to the objects.

In some demonstrative embodiments, the objects may include other vehicles, pedestrians, traffic signs, traffic lights, roads and/or the like.

In some demonstrative embodiments, the one or more parameters, attributes and/or information with respect to an object may include a range of the object from the vehicle 100, an angle of the object with respect to the vehicle 100, a location of the object with respect to the vehicle 100, a relative speed of the object, and/or the like.

In some demonstrative embodiments, device 102 may include an information processor 196 configured to perform and/or to trigger, cause, instruct and/or control device 102 to perform one or more functionalities, operations and/or procedures, and/or to communicate one or more messages and/or transmissions.

In some demonstrative embodiments, information processor 196 may include, or may be implemented, partially or entirely, by circuitry and/or logic, e.g., one or more processors including circuitry and/or logic, memory circuitry and/or logic. Additionally or alternatively, one or more functionalities of information processor 196 may be implemented by logic, which may be executed by a machine and/or one or more processors, e.g., as described below.

In one example, information processor 196 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In other embodiments, information processor 196 may be implemented by one or more additional or alternative elements of device 102.

In some demonstrative embodiments, information processor 196 may include a radar processor configured to process radar information of radar device 102 and/or to control one or more operations of radar device 102, e.g., as described below.

In some demonstrative embodiments, information processor 196 may be configured to generate radar information, for example, based on radar signals communicated by device 102, e.g., as described below.

In some demonstrative embodiments, vehicle 100 may include a vehicular controller 124 configured to control one or more functionalities, components, devices, systems and/or elements of vehicle 100.

In some demonstrative embodiments, vehicular controller 124 may be configured to control one or more vehicular systems 118 of vehicle 100, e.g., as described below.

In some demonstrative embodiments, vehicular systems 118 may include, for example, a steering system, a braking system, a driving system, and/or any other system of the vehicle 100.

In some demonstrative embodiments, vehicular controller 124 may configured to control device 102, and/or to process one or more parameters, attributes and/or information from information processor 196 and/or device 102.

In some demonstrative embodiments, vehicular controller 124 may be configured, for example, to control the vehicular systems 118 of the vehicle, for example, based on the radar information from information processor 196, and/or one or more other sensors of the vehicle, e.g., Light Detection and Ranging (LIDAR) sensors, camera sensors, and/or the like.

In one example, vehicular controller 124 may control the steering system, the braking system, and/or any other vehicular systems 118 of vehicle 100, for example, based on the information from device 102, e.g., based on one or more objects detected by device 102.

In other embodiments, vehicular controller 124 may be configured to control any other additional or alternative functionalities of vehicle 100.

In some demonstrative embodiments, device 102 may include or may be implemented as part of a wireless communication device configured to communicate with one or more other wireless communication devices in a wireless communication system.

In some demonstrative embodiments, system 100 may include a wireless communication system including the wireless communication device 102.

In some demonstrative embodiments, information processor 196 may be configured to control and/or process one or more wireless communications to be transmitted by and/or received by device 102. For example, information processor 196 may be configured to process information to be transmitted in a wireless communication transmission by device 102, and/or to process information received by device 102 in one or more wireless communication transmissions.

In one example, device 102 may include, for example, a UE, an MD, a STA, an AP, a PC, a desktop computer, a mobile computer, a laptop computer, an Ultrabook™ computer, a notebook computer, a tablet computer, a server computer, a handheld computer, an Internet of Things (IoT) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "carry Small Live Large" (CSLL) device, an Ultra Mobile Device (UMD), an Ultra Mobile PC (UMPC), a Mobile Internet Device (MID), or the like.

In some demonstrative embodiments, device 102 may include, for example, one or more of a processor 191, an input unit 192, an output unit 193, a memory unit 194, and/or a storage unit 195. Device 102 may optionally include other suitable hardware components and/or software components. In some demonstrative embodiments, some or all of the components of one or more of device 102 may be enclosed in a common housing or packaging, and may be interconnected or operably associated using one or more wired or wireless links. In other embodiments, components of one or more of device 102 may be distributed among multiple or separate devices.

In some demonstrative embodiments, processor 191 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 executes instructions, for example, of an Operating System (OS), e.g., a vehicular operating system, of device 102 and/or of one or more suitable applications.

In some demonstrative embodiments, input unit 192 may include, for example, a touch-screen, a touch-pad, a trackball, a stylus, a microphone, or other suitable pointing device or input device. Output unit 193 includes, for example, a monitor, a screen, a touch-screen, a flat panel display, a Light Emitting Diode (LED) display unit, a Liquid Crystal Display (LCD) display unit, one or more audio speakers or earphones, or other suitable output devices.

In some demonstrative embodiments, memory unit 194 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 195, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by device 102.

In some demonstrative embodiments, information processor 196 may be configured to perform and/or to trigger, cause, instruct and/or control device 102 to perform one or more functionalities, operations and/or procedures, and/or to perform one or more wireless communications, to generate and/or communicate one or more messages and/or wireless transmissions.

In some demonstrative embodiments, device 102 may include a message processor 128 configured to generate, process and/or access one or more messages communicated by device 102.

In one example, message processor 128 may be configured to generate one or more messages to be transmitted by device 102, and/or message processor 128 may be configured to access and/or to process one or more messages received by device 102, e.g., as described below.

In some demonstrative embodiments, message processor 128 may include, or may be implemented, partially or entirely, by circuitry and/or logic, e.g., one or more processors including circuitry and/or logic, memory circuitry and/or logic. Additionally or alternatively, one or more functionalities of message processor 128 may be implemented by logic, which may be executed by a machine and/or one or more processors, e.g., as described below.

In some demonstrative embodiments, at least part of the functionality of message processor 128 may be implemented as part of information processor 196.

In other embodiments, the functionality of message processor 128 may be implemented as part of any other element of device 102.

In some demonstrative embodiments, at least part of the functionality of information processor 196 and/or message processor 128 may be implemented by an integrated circuit, for example, a chip, e.g., a System on Chip (SoC). In one example, the chip or SoC may be configured to perform one or more functionalities of information processor 196, and one or more functionalities of message processor 128. In one example, information processor 196 and message processor 128 may be implemented as part of the chip or SoC.

In other embodiments, information processor 196 and/or message processor 128 may be implemented by one or more additional or alternative elements of device 102.

In some demonstrative embodiments, device 102 may include a plurality of Physical Layer (PHY) chains 120 configured to communicate RF signals, for example, RF radar signals and/or RF wireless communication signals.

In some demonstrative embodiments, PHY chains 120 may include RF elements, RF circuitry and/or RF logic; baseband elements, circuitry and/or logic; modulation elements, circuitry and/or logic; demodulation elements, circuitry and/or logic; amplifiers; analog to digital and/or digital to analog converters; filters; and/or the like.

In some demonstrative embodiments, device 102 may include a plurality of antennas 107 connected to the plurality of PHY chains 120, e.g., as described below.

In some demonstrative embodiments, the plurality of antennas 107 may include, or may be implemented by, a Multiple-Input-Multiple-Output (MIMO) antenna, for example, a MIMO radar antenna and/or a MIMO wireless communication antenna e.g., as described below. In other embodiments, the plurality of antennas 107 may include, or may be implemented by, any other type of antenna.

In one example, antennas 107 may include or may be part of any type of antennas suitable for transmitting and/or receiving radar signals and/or wireless communication signals. For example, antennas 107 may be implemented as part of any suitable configuration, structure, and/or arrangement of one or more antenna elements, components, units, assemblies, and/or arrays. For example, antennas 107 may be implemented as part of a phased array antenna, a multiple element antenna, a set of switched beam antennas, and/or the like. In some embodiments, antennas 107 may be implemented to support transmit and receive functionalities using separate and/or different transmit antenna elements and receive antenna elements. In some embodiments, antennas 107 may be implemented to support transmit and receive functionalities using common and/or integrated transmit/receive elements.

In some demonstrative embodiments, information processor 196 may be configured to generate radar information, for example, based on radar signals communicated by the plurality of PHY chains 120 via the plurality of antennas 107, for example, when device 102 is implemented as part of, or includes, a radar device, e.g., as described below.

In some demonstrative embodiments, information processor 196 may be configured to process wireless communication signals communicated by the plurality of PHY chains 120 via the plurality of antennas 107, for example, when device 102, is implemented as part of, or includes, a wireless communication device.

In some demonstrative embodiments, one or more elements and/or components of the plurality of PHY chains 120 may be synchronized in time, for example, to achieve an accurate beamforming and/or Angle of Arrival (AoA) estimation.

In one example, different elements of a very large MIMO array, for example, in automotive imaging radar systems, may be tightly synchronized in time, for example, in order to achieve a very accurate beamforming and/or AoA performance, e.g., an accuracy of between 0.1-1 degrees, or any other accuracy level.

For example, elements of a MIMO array, e.g., antennas 107 and/or PHY chains 120, may be required to start receive and/or transmit at the same time, for example, within an accuracy of picoseconds (psec), for example, to support the use of a high carrier frequency, e.g., a frequency between tens and hundreds of GHz, for example, as may be used by automotive radar systems, wireless communication systems, and/or any other systems.

In some demonstrative embodiments, there may be a need to synchronize between the elements of the MIMO array, e.g., antennas 107 and/or PHY chains 120, for example, during a system wakeup flow and/or any other operation and/or procedure, which may require getting out of a reset, for example, while the reset may even be asynchronous.

In some demonstrative embodiments, achieving a synchronized RESET between the elements of the MIMO array, e.g., antennas 107 and/or PHY chains 120, may provide a technical solution, which may significantly reduce a system complexity, for example, by achieving a required alignment between the elements of the MIMO array, e.g., antennas 107 and/or PHY chains 120, and/or by avoiding complex expensive calibrations, e.g., to compensate for reset timing missalignments after system wake up.

In some demonstrative embodiments, calibrating elements of a MIMO array, for example, based on known targets, and/or by using internal Hardware (HW) to measure delays, may have one or more technical inefficiencies, disadvantages and/or problems in one or more use cases, scenarios, and/or implementations. For example, such calibration may be expensive, may be complicated, may have a limited performance of accuracy, which may impact Key Performance indicators (KPIs), may require a lot of effort, e.g., to maintain a performance for production, and/or may not be accurate, e.g., since the calibration may be subjected to many impairments.

In some demonstrative embodiments, device 102 may include a clock 122 configured to generate a Local Oscillator (LO) signal 123 to be distributed to elements of PHY chains 120, e.g., as described below.

In some demonstrative embodiments, LO signal 123 may have a frequency above 10 Gigahertz (GHz), for example, a frequency between 10 Ghz and 120 GHz. For example, LO signal 123 may have a frequency above 30 Ghz, for example, above 45 GHz, e.g., above 60 GHz. In one example, LO signal 123 may have a frequency between 76 GHz and 81 GHz, e.g., to support an implementation of automotive radar, and./or any other implementation. In another example, LO signal 123 may have a frequency above 45 Ghz, e.g., to support an implementation of wireless communication over a mmWave frequency band. In other embodiments, LO signal 123 may be configured to any other frequency band and/or range.

In some demonstrative embodiments, device 102 may include a reset source 126 configured to generate, trigger, and/or release a reset signal 127 to be distributed to elements of PHY chains 120, e.g., as described below.

In some demonstrative embodiments, there may be one or more technical inefficiencies, disadvantages and/or problems, e.g., in one or more use cases, scenarios, and/or implementations, for implementing a topology in which each PHY element 120 is configured to receive the LO signal 123, and wherein each PHY element includes a synchronizer to receive reset signal 127 from reset source 126.

In one example, the synchronizer may sample the reset signal 127, and may reset elements of the PHY chain 120 based on the reset signal 127. However, this implementation may not provide accurate synchronization between the different PHY chains 120, and/or may be complicated. For example, this implementation may add a non-deterministic variance across the plurality of PHY chains 120, e.g., due to double buffer sampling.

In some demonstrative embodiments, device 102 may be configured according to a reset distribution scheme, which may be configured to distribute reset signal 127 to PHY chains 120, e.g., as described below.

In some demonstrative embodiments, device 102 may be configured to implement a synchronized reset of the plurality of PHY chains 120 based on reset signal 127, for example, during a system wakeup, for example, in a manner which may support a technical solution to avoid the implementation of a synchronizer, e.g., as described below.

In some demonstrative embodiments, device 102 may be configured to modulate the LO signal 123 based on reset signal 127, e.g., as described below.

In some demonstrative embodiments, a location of distribution of LO signal 123 to the PHY chains 120 may be agnostic to the modulation of LO signal 123 based on the reset signal 127.

In one example, the modulation of the reset signal 127 over the LO signal 123 may be applied, for example, over an on-board LO distribution, e.g., in an implementation where LO signal 123 is generated and/or modulated outside of and/or separate from, PHY chains 120.

In another example, the modulation of the reset signal 127 over the LO signal 123 may be applied, for example, via off-board LO distribution, e.g., in an implementation where the LO signal 123 may be internally generated and/or modulated, for example, within an RF chip of PHY chains 120, such that the LO signal 123 may be distributed to other elements of PHY chains 120.

In some demonstrative embodiments, device 102 may include an LO generator 130 configured to generate a distributed modulated LO signal 125, for example, by modulating an LO signal 123 based on reset signal 127, e.g., as described below.

In some demonstrative embodiments, LO generator 130 may be implemented in platforms having a common high frequency clock, e.g., clock 122, which may be used for an entire array of elements, e.g., elements of the plurality of PHY chains 120. For example, such platforms may be implemented for high frequencies, e.g., frequencies between 30-300 GHz, or any other frequencies. A common clock, e.g., clock 122, may be implemented, for example, to achieve a common phase noise between the array elements. For example, the common clock 122 may be distributed evenly to elements of PHY chains 120, and may be utilized as a source clock for RF elements in the PHY chains 120.

For example, the common clock 122 may be balanced and calibrated, for example, in platforms where the LO signal 123 may be a critical signal. Therefore, modulating the reset signal 127 on the LO signal 123 may achieve a technical solution of synchronizing the reset signal 127 across the plurality of PHY chains 120, for example, even without routing dedicated lines, which may be relatively complicated, and/or even without using techniques to calibrate an impact of the reset signal 127 on array timing alignment, which may include very complicated flows.

In some demonstrative embodiments, the distributed modulated LO signal 125 may be distributed to the plurality of PHY chains 120, e.g., as described below.

In some demonstrative embodiments, the plurality of PHY chains 120 may receive the distributed modulated LO signal 125, which may be distributed to the plurality of PHY chains 120 by LO generator 130, e.g., as described below.

In some demonstrative embodiments, a PHY chain 121 of the plurality of PHY chains 120 may include a reset detector 132, e.g., as described below.

In one example, each PHY chain of PHY chains 120 may be configured to include the detector 132. In other embodiments, only some of the PHY chains may implement the detector.

In some demonstrative embodiments, reset detector 132 may be configured to detect the reset signal 127, for example, based on the distributed modulated LO signal 125, and to reset one or more RF elements 134 of the PHY chain 121, for example, based on detection of the reset signal 127, e.g., as described below.

In some demonstrative embodiments, reset detector 132 may be configured to reset the one or more RF elements 134 of the PHY chain 121, for example, by releasing, triggering, indicating and/or sending a reset signal 133 to the one or more RF elements 134, e.g., as described below.

In some demonstrative embodiments, reset detector 132 may be configured to reset one or more digital-domain PHY elements of the PHY chain 121, for example, based on the detection of the reset signal, e.g., as described below.

In some demonstrative embodiments, RF elements 134 may be configured to communicate RF signals, for example, based on the distributed modulated LO signal 125, e.g., as described below.

In some demonstrative embodiments, for example, the RF elements 134 may include, for example, modulation elements, circuitry and/or logic; demodulation elements, circuitry and/or logic; amplifiers; analog to digital and/or digital to analog converters; filters, and the like.

In some demonstrative embodiments, the RF signals may include wireless communication signals, for example, in an implementation where device 102 includes a wireless communication device.

In some demonstrative embodiments, the RF signals may include radar signals, for example, in an implementation where device 102 includes a radar.

In some demonstrative embodiments, the distributed modulated LO signal 124 may be configured to synchronize communication of the plurality of PHY chains 120, e.g., as described below.

In some demonstrative embodiments, LO generator 130 may be configured to modulate the reset signal 127 over the distributed modulated LO signal 125, which may be distributed to the plurality of PHY chains 120.

In some demonstrative embodiments, generating the distributed modulated LO signal 125 by modulating LO signal 123 based on the reset signal 127 may provide a relatively simple solution, e.g., from a system implementation perspective, for example, to trigger a synchronized RESET across a massive antenna array, e.g., in a very accurate resolution.

In some demonstrative embodiments, implementation of LO generator 130 may provide a low cost and/or a low risk technical solution, for example, from a routing perspective, for example, where fan-out reset for a massive antenna array may have a long rise time, and resulting in-accuracies may require complicated system solutions.

In some demonstrative embodiments, implementation of LO generator 130 may provide a technical solution for avoiding additional complex routing, for example, by using existing routing to deliver the reset signal 127 over the modulated LO signal 125.

In some demonstrative embodiments, implementation of LO generator 130 may provide a technical solution of accurate and/or synchronized reset, which may support reduction of system overhead. For example, implementation of LO generator 130 may provide a technical solution avoiding a task of measuring post reset accuracy in a measure of psec. This task may be very complicated, may increase cost, e.g., by increasing chip area, power consumption, latency, and/or overall system risk.

In some demonstrative embodiments, LO generator 130 may be configured to modulate the reset signal 127 over the LO signal 123, for example, according to an amplitude modulation scheme, a Frequency modulation scheme, and/or a Phase modulation scheme, e.g., as described below.

In some demonstrative embodiments, LO generator 130 may be configured to generate the distributed modulated LO signal 125, for example, by modulating an amplitude of the LO signal 123, for example, based on the reset signal 127, e.g., as described below.

In some demonstrative embodiments, LO generator 130 may be configured to generate the distributed modulated LO signal 125, for example, based on a reset event indicated by the reset signal 127.

In some demonstrative embodiments, LO generator 130 may be configured to generate the distributed modulated LO signal 125 by applying a predefined amplitude change to the amplitude of the LO signal 123, for example, based on a reset event indicated by the reset signal 127, e.g., as described below.

In some demonstrative embodiments, reset detector 132 may be configured to reset (133) the one or more RF elements 134, for example, based on a detection of the predefined amplitude change in the amplitude of the distributed modulated LO signal 125, e.g., as described below.

In some demonstrative embodiments, LO generator 130 may be configured to, based on the reset event indicated by the reset signal 127, generate the distributed modulated LO signal 125, for example, having an amplitude above a predefined amplitude threshold, e.g., as described below.

In some demonstrative embodiments, reset detector 132 may be configured to reset (133) the one or more RF elements 134, for example, based on a detection that the amplitude of the distributed modulated LO signal 125 is above the predefined amplitude threshold, e.g., as described below.

Figure 2:
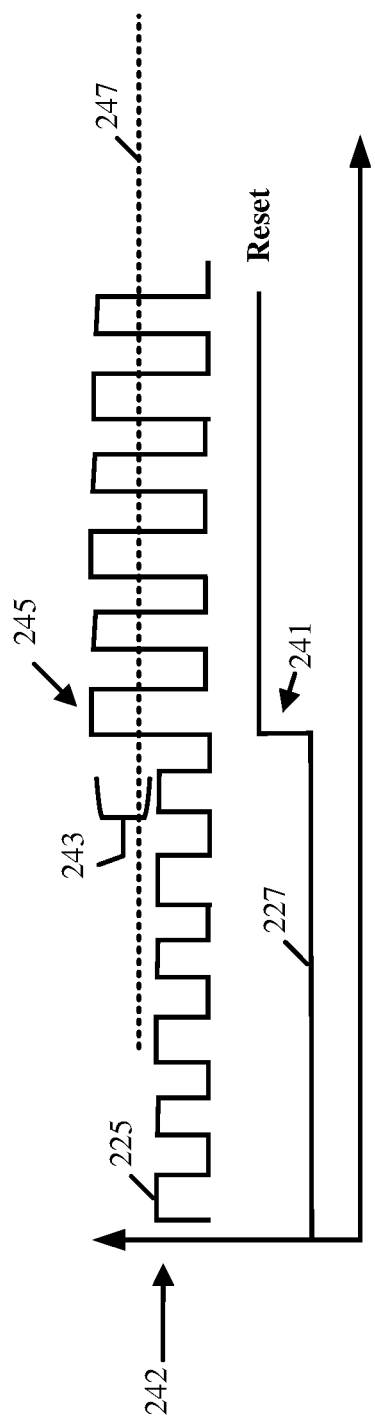
FIG. 2 is a schematic illustration of a distributed modulated Local Oscillator (LO) signal based on a reset signal, in accordance with some demonstrative embodiments.

Reference is made to FIG. 2, which schematically illustrates a distributed modulated LO signal 225 based on a reset signal 227, in accordance with some demonstrative embodiments.

In some demonstrative embodiments, LO generator 130 (FIG. 1) may be configured to generate distributed modulated LO signal 225 based on reset signal 227, e.g., as described below. For example, distributed modulated LO signal 125 (FIG. 1) may include distributed modulated LO signal 225.

In some demonstrative embodiments, LO generator 130 (FIG. 1) may be configured to generate the distributed modulated LO signal 225, for example, based on a reset event 241 indicated by the reset signal 227, by applying a predefined amplitude change 243 to an amplitude 242 of the LO signal 223.

In some demonstrative embodiments, LO generator 130 (FIG. 1), may be configured to, based on the reset event 241, generate the distributed modulated LO signal 225, for example, having an amplitude 245 above a predefined amplitude threshold 247, e.g., as described below.

In other embodiments, LO generator 130 (FIG. 1), may be configured to modulate the reset signal 227 over the distributed modulated LO signal 225, for example, by modulating the amplitude of the distributed modulated LO signal 225, for example, from high to low, using several amplitude transitions, e.g., to support robust system detection, and/or based on any other technique or method of amplitude modulation.

In some demonstrative embodiments, as shown in FIG. 2, distributed modulated LO signal 225 may be maintained active and, based on a reset even, e.g., from low to high, an amplitude of distributed modulated LO signal 225 may be increased above a pre-defined detectable threshold, e.g., the predefined amplitude threshold 247, which may be detected by an internal buffer, e.g., implemented by detector 132 (FIG. 1).

In some demonstrative embodiments, the amplitude modulation of distributed modulated LO signal 225 based on the reset signal 227 may provide a technical solution of maintaining distributed modulated LO signal 225 active. As a result, lines on the board may be loaded, and a capacitance change, e.g., when amplitude increases, may be maintained at a minimum. This solution may reduce high frequency content of an amplitude change of the distributed modulated LO signal 225.

Figure 3:
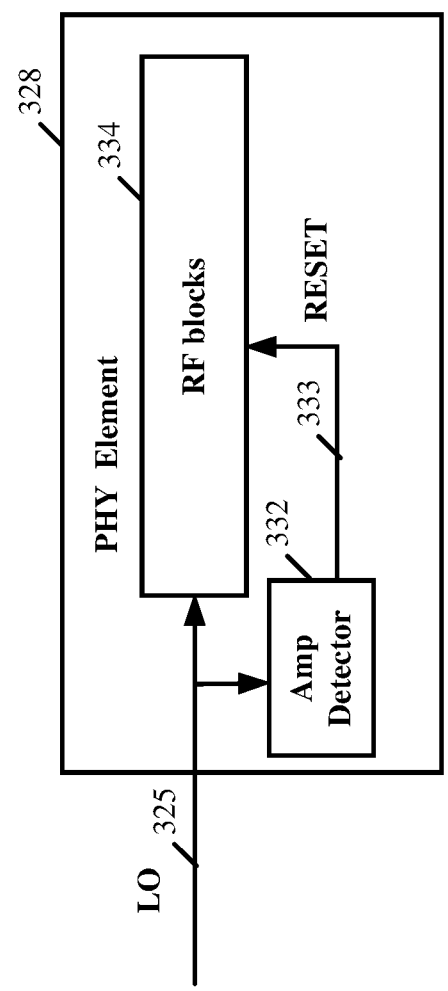
FIG. 3 is a schematic block diagram illustration of a Physical Layer (PHY) chain configured to detect a reset signal based on a distributed modulated LO signal, in accordance with some demonstrative embodiments.

Reference is made to FIG. 3, which schematically illustrates a PHY chain 328 configured to detect a reset signal based on a distributed modulated LO signal 325, in accordance with some demonstrative embodiments. For example, PHY chain 121 (FIG. 1) may include one or more elements of, and/or may perform one or more operations of, and/or one or more functionalities of, PHY chain 328.

In some demonstrative embodiments, as shown in FIG. 3, PHY chain 328 may include an amplitude detector 332, and one or more RF elements 334, which may be configured to communicate RF signals based on the distributed modulated LO signal 325, e.g., as described below. For example, reset detector 132 (FIG. 1) may include one or more elements of, and/or may perform one or more operations of, and/or one or more functionalities of, amplitude detector 332; and/or RF elements 134 (FIG. 1) may include one or more elements of, and/or may perform one or more operations of, and/or one or more functionalities of, RF elements 334.

In some demonstrative embodiments, for example, amplitude detector 333 may implement an input buffer stage to release a reset signal 333 to the RF elements 334, for example, based on the detection of an amplitude change in the distributed modulated LO signal 325, e.g., as described below.

In some demonstrative embodiments, distributed modulated LO signal 325 may include an LO signal modulated based on a reset signal, e.g., as described above.

In one example, distributed modulated LO signal 325 may include the distributed modulated LO signal 225 (FIG. 2), which may be modulated based on the reset signal 227 (FIG. 2), e.g., as described above.

In some demonstrative embodiments, amplitude detector 332 may be configured to detect the reset signal based on the distributed modulated LO signal 325, and, to reset (333) RF elements 334, for example, based on detection of the reset signal, e.g., as described below.

In some demonstrative embodiments, amplitude detector 332 may be configured to reset 333 the one or more RF elements 334, for example, based on a detection of a predefined amplitude change in the amplitude of the distributed modulated LO signal 325, e.g., as described below.

In one example, amplitude detector 332 may be configured to reset (333) the one or more RF elements 334, for example, based on a detection of the predefined amplitude change 243 (FIG. 2) in the amplitude 242 (FIG. 2) of the distributed modulated LO signal 225 (FIG. 2).

In some demonstrative embodiments, reset detector 332 may be configured to reset (333) the one or more RF elements 334, for example, based on a detection that an amplitude of the distributed modulated LO signal 325 is above a predefined amplitude threshold, e.g., as described below.

In one example, reset detector 332 may be configured to reset (333) the one or more RF elements 334, for example, based on a detection that an amplitude 245 (FIG. 2) of the distributed modulated LO signal 225 (FIG. 2) is above the predefined amplitude threshold 247 (FIG. 2).

In some demonstrative embodiments, as shown in FIG. 3, distributed modulated LO signal 325 may be inputted in parallel to an RF domain, e.g., RF elements 334, and to amplitude detector 332, for example, to enable amplitude detector 332 to release reset 333 to the RF domain, e.g., in synchronization with the Lo signal provided to the RF domain.

In some demonstrative embodiments, reset 333 may be released into a digital-domain, for example, to reset real-time logic, which may support the RF-domain, e.g., Analog to Digital Converter (ADC) digital logic, Digital to Analog Converter (DAC) digital logic, controllers, and the like.

Referring back to FIG. 1, in some demonstrative embodiments, LO generator 130 may modulate the reset signal 127 over the LO signal 123, for example, based on a frequency modulation scheme and/or a phase modulation scheme, e.g., as described below.

In some demonstrative embodiments, LO generator 130 may be configured to generate the distributed modulated LO signal 125 by modulating a frequency of the LO signal 123, for example, based on the reset signal 127, e.g., as described below.

In some demonstrative embodiments, LO generator 130 may be configured to, based on the reset event indicated by the reset signal 127, generate the distributed modulated LO signal 125 having a frequency, which is lower than a predefined frequency threshold, for a predefined time period, e.g., as described below.

In some demonstrative embodiments, reset detector 132 may be configured to reset (133) the one or more RF elements 134, for example, based on a detection that the frequency of the distributed modulated LO signal is below the predefined frequency threshold for a predefined detection period, e.g., as described below.

In some demonstrative embodiments, reset detector 132 may be configured to reset the one or more RF elements 134, for example, within the predefined time period, e.g., as described below.

In some demonstrative embodiments, the predefined detection period may be shorter than the predefined time period, e.g., as described below.

In some demonstrative embodiments, LO generator 130 may be configured to, based on the reset event indicated by the reset signal 127, generate the distributed modulated LO signal 125 including a predefined modulation sequence, e.g., as described below.

In some demonstrative embodiments, reset detector 132 may be configured to reset (133) the one or more RF elements 134, for example, based on a detection of the predefined modulation sequence in the distributed modulated LO signal 125, e.g., as described below.

In some demonstrative embodiments, the predefined modulation sequence may include a predefined frequency modulation sequence and/or a predefined phase modulation sequence, e.g., as described below.

In some demonstrative embodiments, LO generator 130 may be configured to, based on the reset event indicated by the reset signal 127, generate the distributed modulated LO signal 125 including a predefined frequency sequence, e.g., as described below.

In some demonstrative embodiments, reset detector 132 may be configured to reset (133) the one or more RF elements 134, for example, based on a detection of the predefined frequency sequence in the distributed modulated LO signal 125, e.g., as described below.

In some demonstrative embodiments, the predefined frequency sequence may include a sequence of frequencies lower than a frequency of the LO signal 123, e.g., as described below.

In other embodiments, the predefined frequency sequence may include any other frequency sequence.

In some demonstrative embodiments, LO generator 130 may be configured to, based on the reset event indicated by the reset signal 127, generate the distributed modulated LO signal 125 including a predefined phase sequence, e.g., as described below.

In some demonstrative embodiments, reset detector 132 may be configured to reset (133) the one or more RF elements 134, for example, based on a detection of the predefined phase sequence in the distributed modulated LO signal 125, e.g., as described below.

In some demonstrative embodiments, the predefined phase sequence may include a predefined phase code, e.g., as described below.

In some demonstrative embodiments, the predefined phase sequence may include any other phase sequence.

Figure 4:
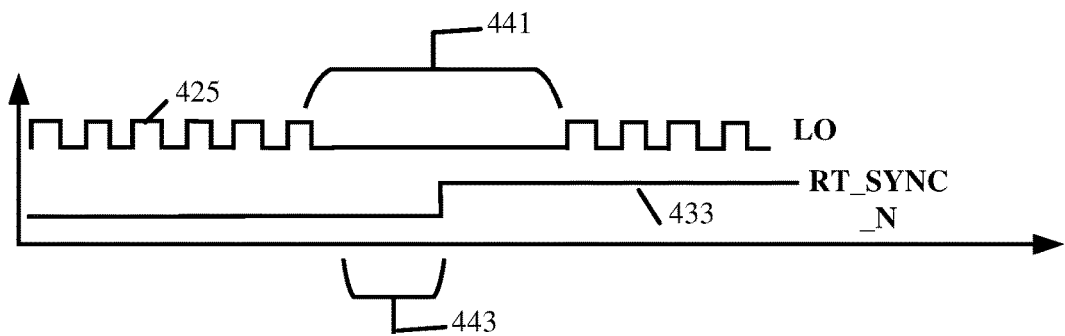
FIG. 4 is a schematic illustration of a distributed modulated LO signal based on a reset signal, in accordance with some demonstrative embodiments.

Reference is made to FIG. 4, which schematically illustrates a distributed modulated LO signal 425 based on a reset signal, in accordance with some demonstrative embodiments.

In some demonstrative embodiments, LO generator 130 (FIG. 1) may be configured to generate distributed modulated LO signal 425 based on reset signal 127 (FIG. 1), e.g., as described below. For example, distributed modulated LO signal 125 (FIG. 1) may include distributed modulated LO signal 425.

In some demonstrative embodiments, LO generator 130 (FIG. 1) may be configured to, based on a reset event indicated by reset signal 127 (FIG. 1), generate the distributed modulated LO signal 425, for example, having a frequency, which is lower than a predefined frequency threshold, for a predefined time period 441, e.g., as described below.

In some demonstrative embodiments, as shown in FIG. 4, the reset signal may be detected, for example, by reset detector 132 (FIG. 1), for example, based on a detection that the frequency of distributed modulated LO signal 425 is below the predefined frequency threshold during a predefined detection period 443, e.g., as described below.

In some demonstrative embodiments, as shown in FIG. 4, the predefined detection period 443 may be shorter than the predefined time period 441.

In some demonstrative embodiments, as shown in FIG. 4, LO generator 130 (FIG. 1) may lower the frequency of distributed modulated LO signal 425 abruptly, for example, to a very low frequency, for example, during a long silence period 441.

In some demonstrative embodiments, reset detector 132 (FIG. 1) may release a reset signal 433, for example, based on detection of the low frequency for the detection period 443. Implementing the reset detector 132 (FIG. 1) in PHY chains 120 (FIG. 1) may support a solution of releasing the reset signal 433 across the plurality of PHY chains 120 (FIG. 1), e.g., synchronously.

Figure 5:
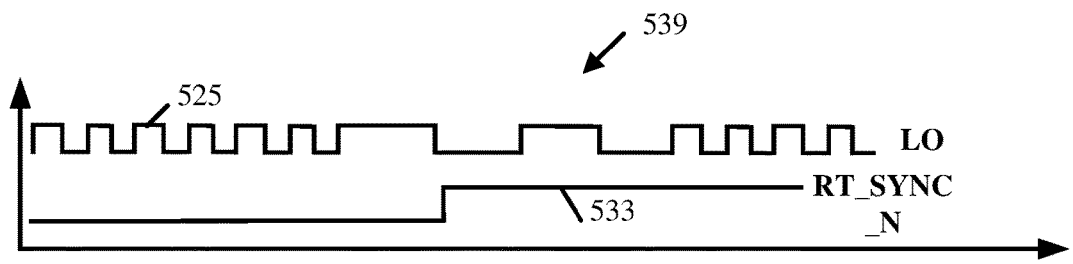
FIG. 5 is a schematic illustration of a distributed modulated LO signal based on a reset signal, in accordance with some demonstrative embodiments.

Reference is made to FIG. 5, which schematically illustrates a distributed modulated LO signal 525 based on a reset signal, in accordance with some demonstrative embodiments.

In some demonstrative embodiments, LO generator 130 (FIG. 1) may be configured to generate distributed modulated LO signal 525 based on reset signal 127 (FIG. 1), e.g., as described below. For example, distributed modulated LO signal 125 (FIG. 1) may include distributed modulated LO signal 525. In other embodiments, LO generator 130 (FIG. 1) may be configured to implement any other additional or alternative frequency modulation scheme and/or phase modulation scheme.

In some demonstrative embodiments, LO generator 130 (FIG. 1) may be configured to, based on a reset event indicated by reset signal 127 (FIG. 1), generate the distributed modulated LO signal 525, for example, including a predefined frequency and/or phase sequence 539, e.g., as described below.

In some demonstrative embodiments, as shown in FIG. 5, the reset signal may be detected, for example, by reset detector 132 (FIG. 1), for example, based on a detection of the predefined frequency and/or phase sequence 539 in the distributed modulated LO signal 525, e.g., as described below.

In some demonstrative embodiments, as shown in FIG. 5, the predefined frequency and/or phase sequence 539 may include a sequence of frequencies lower than a frequency 537 of the LO signal 123 (FIG. 1).

In some demonstrative embodiments, as shown in FIG. 5, the predefined frequency and/or phase sequence 539 may include a predefined phase code.

In some demonstrative embodiments, as shown in FIG. 5, LO generator 130 (FIG. 1) may be configured to reduce the frequency of the distributed modulated LO signal 525 to a pre-defined frequency and/or to modulate a specific phase code onto the distributed modulated LO signal 525.

In some demonstrative embodiments, reset detector 132 (FIG. 1) may release a reset signal 533, for example, based on detection of the predefined frequency and/or phase sequence 539. Implementing the reset detector 132 (FIG. 1) in the PHY chains 120 (FIG. 1) may support a solution of releasing the reset signal 533 across the plurality of PHY chains 120 (FIG. 1), e.g., synchronously.

Figure 6:
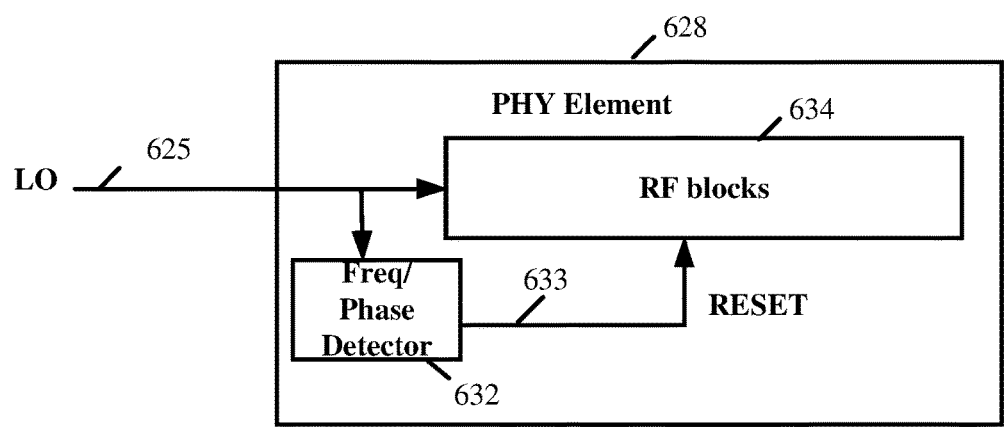
FIG. 6 is a schematic block diagram illustration of a PHY chain configured to detect a reset signal based on a distributed modulated LO signal, in accordance with some demonstrative embodiments.

Reference is made to FIG. 6, which schematically illustrates a PHY chain 628 configured to detect a reset signal based on a distributed modulated LO signal 625, in accordance with some demonstrative embodiments. For example, PHY chain 121 (FIG. 1) may include one or more elements of, and/or may perform one or more operations of, and/or one or more functionalities of, PHY chain 628.

In some demonstrative embodiments, as shown in FIG. 6, PHY chain 628 may include a detector 632, and one or more RF elements 634, which may be configured to communicate RF signals based on the distributed modulated LO signal 625, e.g., as described below. For example, reset detector 132 (FIG. 1) may include one or more elements of, and/or may perform one or more operations of, and/or one or more functionalities of, detector 632; and/or RF elements 134 (FIG. 1) may include one or more elements of, and/or may perform one or more operations of, and/or one or more functionalities of, RF elements 634.

In some demonstrative embodiments, for example, detector 632 may implement an input buffer stage to release a reset signal 633 to the RF elements 634, for example, based on the detection of a reset event in the distributed modulated LO signal 625, e.g., as described below.

In some demonstrative embodiments, distributed modulated LO signal 625 may include an LO signal modulated based on a reset signal, e.g., as described above.

In one example, distributed modulated LO signal 625 may include the distributed modulated LO signal 425 (FIG. 4), which may be modulated based on the reset signal 227 (FIG. 2), e.g., as described above.

In another example, distributed modulated LO signal 625 may include the distributed modulated LO signal 525 (FIG. 5), which may be modulated based on the reset signal 227 (FIG. 2), e.g., as described above.

In some demonstrative embodiments, detector 632 may be configured to detect the reset signal based on the distributed modulated LO signal 625, and, to reset (633) RF elements 634, for example, based on detection of the reset signal, e.g., as described below.

In some demonstrative embodiments, detector 632 may be configured to reset (633) the one or more RF elements 634, for example, based on a detection that a frequency of the distributed modulated LO signal 625 is below a predefined frequency threshold for a predefined detection period, e.g., as described below.

In one example, detector 632 may be configured to reset (633) the one or more RF elements 634, for example, based on a detection that the frequency of the distributed modulated LO signal 625 is below the predefined frequency threshold for predefined detection period 443 (FIG. 4).

In some demonstrative embodiments, detector 632 may be configured to reset (633) the one or more RF elements 634, based on the detection of the reset signal, for example, within the time period 441 (FIG. 4).

In some demonstrative embodiments, detector 632 may be configured to detect a long silence period in distributed modulated LO signal 625, e.g., time period 441 (FIG. 4), and to release reset 633.

In some demonstrative embodiments, detector 632 may be configured to reset (633) the one or more RF elements 634, for example, based on a detection of a predefined frequency and/or phase sequence in the distributed modulated LO signal 625, e.g., as described below.

In one example, detector 632 may be configured to reset (633) the one or more RF elements 634, for example, based on a detection of the predefined frequency and/or phase sequence 539 (FIG. 5) in the distributed modulated LO signal 625.

In some demonstrative embodiments, frequency/phase detector 632 may internally release the reset 633 to the RF elements 634 synchronously, for example, when the predefined frequency and/or phase sequence, e.g., the predefined frequency and/or phase sequence 539 (FIG. 5), is detected.

In some demonstrative embodiments, as shown in FIG. 6, distributed modulated LO signal 625 may be inputted in parallel to an RF domain, e.g., RF elements 634, and to detector 632, for example, to enable detector 632 to release reset 633 to the RF domain, e.g., in synchronization with the LO signal provided to the RF domain.

In some demonstrative embodiments, reset 633 may be released into a digital-domain, for example, to reset real-time logic, which may support the RF-domain, e.g., Analog to Digital Converter (ADC) digital logic, Digital to Analog Converter (DAC) digital logic, controllers, and the like.

Figure 7:
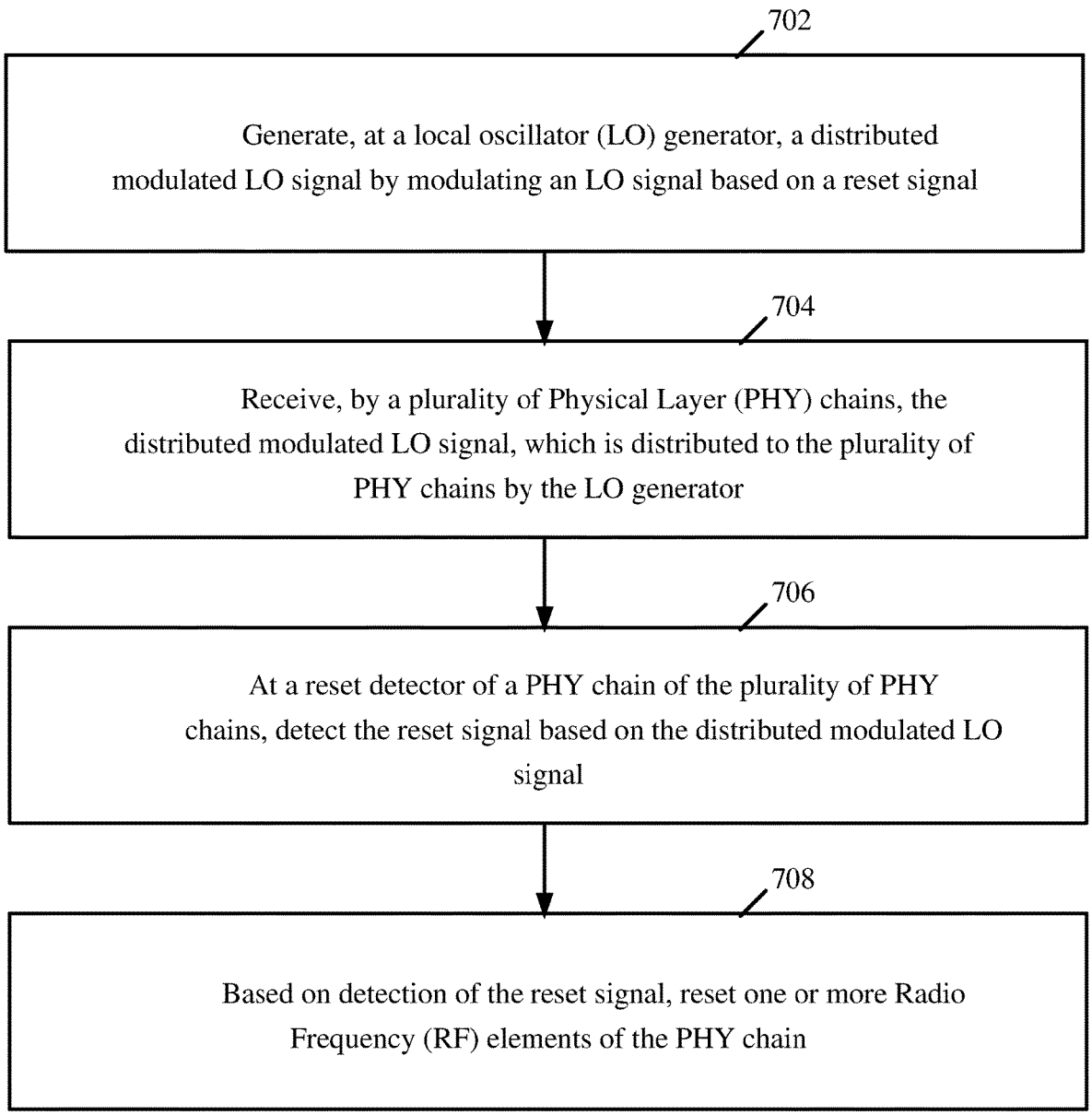
FIG. 7 is a schematic flow chart illustration of a method of distributing a reset signal to a plurality of PHY chains, in accordance with some demonstrative embodiments.

Reference is made to FIG. 7, which schematically illustrates a method of distributing a reset signal to a plurality of PHY chains, in accordance with some demonstrative embodiments. For example, one or more operations of the method of FIG. 7 may be performed by one or more elements of a system, e.g., system 101 (FIG. 1), a vehicle, e.g., vehicle 100 (FIG. 1), a device, e.g., device 102 (FIG. 1), an LO generator, e.g., LO generator 130 (FIG. 1), a PHY chain, e.g., PHY chains 120 (FIG. 1), and/or a reset detector, e.g., reset detector 132 (FIG. 1).

As indicated at block 702, the method may include generating a distributed modulated LO signal at an LO generator, by modulating an LO signal based on a reset signal. For example, LO generator 130 (FIG. 1) may generate distributed modulated LO signal 125 (FIG. 1) by modulating LO signal 123 (FIG. 1) based on reset signal 127 (FIG. 1), e.g., as described above.

As indicated at block 704, the method may include receiving, by a plurality of PHY chains, the distributed modulated LO signal, which is distributed to the plurality of PHY chains by the LO generator. For example, the plurality of PHY chains 120 (FIG. 1) may receive the distributed modulated LO signal 125 (FIG. 1), which is distributed to the plurality of PHY chains 120 (FIG. 1) by the LO generator 130 (FIG. 1), e.g., as described above.

As indicated at block 706, the method may include detecting, at a reset detector of a PHY chain of the plurality of PHY chains, the reset signal based on the distributed modulated LO signal. For example, reset detector 132 (FIG. 1) may detect the reset signal 127 (FIG. 1) based on the distributed modulated LO signal 125 (FIG. 1), e.g., as described above.

As indicated at block 708, the method may include resetting one or more Radio Frequency (RF) elements of the PHY chain based on detection of the reset signal. For example, reset detector 132 (FIG. 1) may reset 133 (FIG. 1) RF elements 134 (FIG. 1) based on detection of the reset signal 127 (FIG. 1), e.g., as described above.

Figure 8:
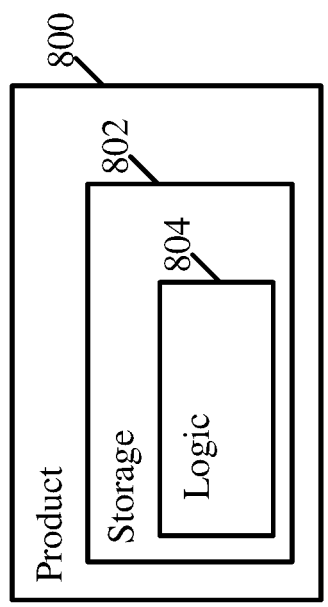
FIG. 8 is a schematic illustration of a product of manufacture, in accordance with some demonstrative embodiments.

Reference is made to FIG. 8, which schematically illustrates a product of manufacture 800, in accordance with some demonstrative embodiments. Product 800 may include one or more tangible computer-readable ("machine-readable") non-transitory storage media 802, which may include computer-executable instructions, e.g., implemented by logic 804, operable to, when executed by at least one computer processor, enable the at least one computer processor to implement one or more operations at device 102 (FIG. 1), LO generator 130 (FIG. 1), PHY chains 120 (FIG. 1), and/or reset detector 132 (FIG. 1). Additionally or alternatively, storage media 802, which may include computer-executable instructions, e.g., implemented by logic 804, operable to, when executed by at least one computer processor, enable the at least one computer processor to cause device 102 (FIG. 1), LO generator 130 (FIG. 1), PHY chains 120 (FIG. 1), and/or reset detector 132 (FIG. 1) to perform, trigger and/or implement one or more operations and/or functionalities, e.g., as described herein. Additionally or alternatively, storage media 802, which may include computer-executable instructions, e.g., implemented by logic 804, operable to, when executed by at least one computer processor, enable the at least one computer processor to perform, trigger and/or implement one or more operations and/or functionalities described with reference to the FIGS. 1, 2, 3, 4, 5, 6 and/or 7, and/or one or more operations described herein. The phrases "non-transitory machine-readable medium" and "computer-readable non-transitory storage media" may be directed to include all computer-readable media, with the sole exception being a transitory propagating signal.

In some demonstrative embodiments, product 800 and/or machine-readable storage media 802 may include one or more types of computer-readable storage media capable of storing data, including volatile memory, non-volatile memory, removable or non-removable memory, erasable or non-erasable memory, writeable or re-writeable memory, and the like. For example, machine-readable storage media 802 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 804 may include instructions, data, and/or code, which, if executed by a machine, may cause the machine to perform a method, process, and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 804 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner, or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

EXAMPLES

The following examples pertain to further embodiments.

Example 1 includes an apparatus comprising a Local Oscillator (LO) generator configured to generate a distributed modulated LO signal by modulating an LO signal based on a reset signal; and a plurality of Physical Layer (PHY) chains to receive the distributed modulated LO signal, which is distributed to the plurality of PHY chains by the LO generator, a PHY chain of the plurality of PHY chains comprising a reset detector configured to detect the reset signal based on the distributed modulated LO signal, and, based on detection of the reset signal, to reset one or more Radio Frequency (RF) elements of the PHY chain.

Example 2 includes the subject matter of Example 1, and optionally, wherein the LO generator is configured to generate the distributed modulated LO signal by modulating an amplitude of the LO signal based on the reset signal.

Example 3 includes the subject matter of Example 2, and optionally, wherein the LO generator is configured to, based on a reset event indicated by the reset signal, generate the distributed modulated LO signal by applying a predefined amplitude change to an amplitude of the LO signal.

Example 4 includes the subject matter of Example 3, and optionally, wherein the reset detector is configured to reset the one or more RF elements based on a detection of the predefined amplitude change in the amplitude of the distributed modulated LO signal.

Example 5 includes the subject matter of Example 2, and optionally, wherein the LO generator is configured to, based on a reset event indicated by the reset signal, generate the distributed modulated LO signal having an amplitude above a predefined amplitude threshold.

Example 6 includes the subject matter of Example 5, and optionally, wherein the reset detector is configured to reset the one or more RF elements based on a detection that the amplitude of the distributed modulated LO signal is above the predefined amplitude threshold.

Example 7 includes the subject matter of any one of Examples 1-6, and optionally, wherein the LO generator is configured to generate the distributed modulated LO signal by modulating a frequency of the LO signal based on the reset signal.

Example 8 includes the subject matter of Example 7, and optionally, wherein the LO generator is configured to, based on a reset event indicated by the reset signal, generate the distributed modulated LO signal having a frequency, which is lower than a predefined frequency threshold, for a predefined time period.

Example 9 includes the subject matter of Example 8, and optionally, wherein the reset detector is configured to reset the one or more RF elements based on a detection that the frequency of the distributed modulated LO signal is below the predefined frequency threshold for a predefined detection period.

Example 10 includes the subject matter of Example 9, and optionally, wherein the predefined detection period is shorter than the predefined time period.

Example 11 includes the subject matter of any one of Examples 8-10, and optionally, wherein the reset detector is configured to reset the one or more RF elements within the predefined time period.

Example 12 includes the subject matter of Example 7, and optionally, wherein the LO generator is configured to, based on a reset event indicated by the reset signal, generate the distributed modulated LO signal comprising a predefined frequency sequence.

Example 13 includes the subject matter of Example 12, and optionally, wherein the reset detector is configured to reset the one or more RF elements based on a detection of the predefined frequency sequence in the distributed modulated LO signal.

Example 14 includes the subject matter of Example 12 or 13, and optionally, wherein the predefined frequency sequence comprises a sequence of frequencies lower than a frequency of the LO signal.

Example 15 includes the subject matter of any one of Examples 1-14, and optionally, wherein the LO generator is configured to generate the distributed modulated LO signal by modulating a phase of the LO signal based on the reset signal.

Example 16 includes the subject matter of Example 15, and optionally, wherein the LO generator is configured to, based on a reset event indicated by the reset signal, generate the distributed modulated LO signal comprising a predefined phase sequence.

Example 17 includes the subject matter of Example 16, and optionally, wherein the reset detector is configured to reset the one or more RF elements based on a detection of the predefined phase sequence in the distributed modulated LO signal.

Example 18 includes the subject matter of Example 16 or 17, and optionally, wherein the predefined phase sequence comprises a predefined phase code.

Example 19 includes the subject matter of any one of Examples 1-18, and optionally, wherein the distributed modulated LO signal is configured to synchronize communication of the plurality of PHY chains.

Example 20 includes the subject matter of any one of Examples 1-19, and optionally, wherein the reset detector is configured to reset one or more digital-domain PHY elements of the PHY chain based on the detection of the reset signal.

Example 21 includes the subject matter of any one of Examples 1-20, and optionally, wherein the one or more RF elements are configured to communicate RF signals based on the distributed modulated LO signal.

Example 22 includes the subject matter of Example 21, and optionally, wherein the RF signals comprise wireless communication signals.

Example 23 includes the subject matter of Example 21, and optionally, wherein the RF signals comprise radar signals.

Example 24 includes the subject matter of any one of Examples 1-23, and optionally, wherein the LO signal has a frequency of at least 30 Gigahertz (GHz).

Example 25 includes the subject matter of any one of Examples 1-24, and optionally, comprising a clock to generate the LO signal.

Example 26 includes the subject matter of any one of Examples 1-25, and optionally, comprising a radar, the radar comprising a plurality of antennas connected to the plurality of PHY chains, and a processor to generate radar information based on radar signals communicated by the plurality of PHY chains via the plurality of antennas.

Example 27 includes the subject matter of Example 26, and optionally, comprising a vehicle, the vehicle comprising the radar, and a vehicular controller to control one or more systems of the vehicle based on the radar information.

Example 28 includes the subject matter of any one of Examples 1-27, and optionally, comprising a wireless communication device, the wireless communication device comprising a plurality of antennas connected to the plurality of PHY chains, and a processor to process wireless communication signals communicated by the plurality of PHY chains via the plurality of antennas.

Example 29 comprises a radar device comprising the apparatus of any one of Examples 1-26.

Example 30 comprises a vehicle comprising the apparatus of any one of Examples 1-26.

Example 31 comprises a wireless communication device comprising the apparatus of any one of Examples 1-25.

Example 32 includes an apparatus comprising means for executing any of the described operations of Examples 1-28.

Example 29 includes a machine-readable medium that stores instructions for execution by a processor to perform any of the described operations of Examples 1-28.

Example 30 includes an apparatus comprising a memory; and processing circuitry configured to perform any of the described operations of Examples 1-28.

Example 31 includes a method including any of the described operations of Examples 1-28.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:
a Local Oscillator (LO) generator configured to generate a distributed modulated LO signal by modulating an LO signal based on a reset signal; and
a plurality of Physical Layer (PHY) chains to receive the distributed modulated LO signal, which is distributed to the plurality of PHY chains by the LO generator, a PHY chain of the plurality of PHY chains comprising a reset detector configured to detect the reset signal based on the distributed modulated LO signal, and, based on a detection of the reset signal, to reset one or more Radio Frequency (RF) elements of the PHY chain.

2. The apparatus of claim 1, wherein the LO generator is configured to generate the distributed modulated LO signal by modulating an amplitude of the LO signal based on the reset signal.

3. The apparatus of claim 2, wherein the LO generator is configured to, based on a reset event indicated by the reset signal, generate the distributed modulated LO signal by applying a predefined amplitude change to the amplitude of the LO signal.

4. The apparatus of claim 3, wherein the reset detector is configured to reset the one or more RF elements based on a detection of the predefined amplitude change in the amplitude of the distributed modulated LO signal.

5. The apparatus of claim 2, wherein the LO generator is configured to, based on a reset event indicated by the reset signal, generate the distributed modulated LO signal having an amplitude above a predefined amplitude threshold.

6. The apparatus of claim 1, wherein the LO generator is configured to generate the distributed modulated LO signal by modulating a frequency of the LO signal based on the reset signal.

7. The apparatus of claim 6, wherein the LO generator is configured to, based on a reset event indicated by the reset signal, generate the distributed modulated LO signal having a frequency, which is lower than a predefined frequency threshold, for a predefined time period.

8. The apparatus of claim 7, wherein the reset detector is configured to reset the one or more RF elements based on a detection that the frequency of the distributed modulated LO signal is below the predefined frequency threshold for a predefined detection period.

9. The apparatus of claim 8, wherein the predefined detection period is shorter than the predefined time period.

10. The apparatus of claim 6, wherein the LO generator is configured to, based on a reset event indicated by the reset signal, generate the distributed modulated LO signal comprising a predefined frequency sequence.

11. The apparatus of claim 1, wherein the LO generator is configured to generate the distributed modulated LO signal by modulating a phase of the LO signal based on the reset signal.

12. The apparatus of claim 11, wherein the LO generator is configured to, based on a reset event indicated by the reset signal, generate the distributed modulated LO signal comprising a predefined phase sequence.

13. The apparatus of claim 1, wherein the distributed modulated LO signal is configured to synchronize communication of the plurality of PHY chains.

14. The apparatus of claim 1, wherein the reset detector is configured to reset one or more digital-domain PHY elements of the PHY chain based on the detection of the reset signal.

15. The apparatus of claim 1, wherein the one or more RF elements are configured to communicate RF signals based on the distributed modulated LO signal.

16. The apparatus of claim 1, wherein the LO signal has a frequency of at least 30 Gigahertz (GHz).

17. The apparatus of claim 1 comprising a radar, the radar comprising a plurality of antennas connected to the plurality of PHY chains, and a processor to generate radar information based on radar signals communicated by the plurality of PHY chains via the plurality of antennas.

18. The apparatus of claim 1 comprising a wireless communication device, the wireless communication device comprising a plurality of antennas connected to the plurality of PHY chains, and a processor to process wireless communication signals communicated by the plurality of PHY chains via the plurality of antennas.

19. A radar device comprising:
a plurality of antennas;
a Local Oscillator (LO) generator configured to generate a distributed modulated LO signal by modulating an LO signal based on a reset signal;
a plurality of Physical Layer (PHY) chains connected to the plurality of antennas, the plurality of PHY chains to receive the distributed modulated LO signal, which is distributed to the plurality of PHY chains by the LO generator, a PHY chain of the plurality of PHY chains comprising a reset detector configured to detect the reset signal based on the distributed modulated LO signal, and, based on a detection of the reset signal, to reset one or more Radio Frequency (RF) elements of the PHY chain; and
a processor to generate radar information based on radar signals communicated by the plurality of PHY chains via the plurality of antennas.

20. The radar device of claim 19, wherein the LO generator is configured to generate the distributed modulated LO signal by modulating an amplitude of the LO signal based on the reset signal.

21. The radar device of claim 19, wherein the LO generator is configured to generate the distributed modulated LO signal by modulating a frequency of the LO signal based on the reset signal.

22. The radar device of claim 19, wherein the LO generator is configured to generate the distributed modulated LO signal by modulating a phase of the LO signal based on the reset signal.

23. The radar device of claim 19, wherein the LO signal has a frequency of at least 30 Gigahertz (GHz).

24. A vehicle comprising:
a system controller configured to control one or more vehicular systems of the vehicle based on radar information; and
a radar device configured to provide the radar information to the system controller, the radar device comprising:
a plurality of antennas;
a Local Oscillator (LO) generator configured to generate a distributed modulated LO signal by modulating an LO signal based on a reset signal;
a plurality of Physical Layer (PHY) chains connected to the plurality of antennas, the plurality of PHY chains to receive the distributed modulated LO signal, which is distributed to the plurality of PHY chains by the LO generator, a PHY chain of the plurality of PHY chains comprising a reset detector configured to detect the reset signal based on the distributed modulated LO signal, and, based on a detection of the reset signal, to reset one or more Radio Frequency (RF) elements of the PHY chain; and
a processor to generate the radar information based on radar signals communicated by the plurality of PHY chains via the plurality of antennas.

25. The vehicle of claim 24, wherein the one or more RF elements are configured to communicate RF signals based on the distributed modulated LO signal.

* * * * *